United States Patent [19]

Mikkor

[11] Patent Number: 4,701,424

[45] Date of Patent: Oct. 20, 1987

[54] HERMETIC SEALING OF SILICON

[75] Inventor: Mati Mikkor, Ann Arbor, Mich.

[73] Assignee: Ford Motor Company, Dearborn, Mich.

[21] Appl. No.: 924,712

[22] Filed: Oct. 30, 1986

[51] Int. Cl.⁴ .............................................. H01L 7/00
[52] U.S. Cl. ................................... 437/209; 357/25;
357/26; 357/74; 228/153; 228/165; 228/171;
228/179; 156/304.2; 156/308.2; 156/309.6;
156/329; 29/25.41; 148/DIG. 12; 437/247
[58] Field of Search ................. 29/588, 25.41, 577 C,
29/591; 148/DIG. 135, DIG. 12; 357/74, 25,
26; 228/153, 165, 171, 179; 156/272.2, 304.2,
308.2, 309.6, 329, 556, 629

[56] References Cited

U.S. PATENT DOCUMENTS

| | | | |
|---|---|---|---|
| 3,351,816 | 11/1967 | Sear et al. | 156/629 |
| 3,471,631 | 10/1969 | Quintana | 156/629 |
| 3,508,980 | 4/1970 | Jackson, Jr. et al. | 148/DIG. 12 |
| 3,689,357 | 9/1972 | Jordan | 156/629 |
| 4,177,496 | 12/1979 | Bell et al. | |
| 4,184,189 | 1/1980 | Davis et al. | |
| 4,207,604 | 6/1980 | Bell | |
| 4,208,782 | 7/1980 | Kurtz et al. | 357/26 |
| 4,236,137 | 11/1980 | Kurtz et al. | 357/26 |
| 4,261,086 | 4/1981 | Giachino et al. | |
| 4,345,299 | 8/1982 | Ho | |
| 4,386,453 | 6/1983 | Giachino et al. | |
| 4,390,925 | 6/1983 | Freud | |
| 4,415,948 | 11/1983 | Grantham et al. | |
| 4,420,790 | 12/1983 | Golke et al. | |
| 4,424,713 | 1/1984 | Kroninger, Jr. et al. | |
| 4,612,082 | 9/1986 | Yasumoto et al. | 427/89 |

FOREIGN PATENT DOCUMENTS 0044548  11/1977  Japan ................... 228/171

Primary Examiner—Brian E. Hearn
Assistant Examiner—Beverly A. Pawlikowski
Attorney, Agent, or Firm—Peter Abolins; Keith L. Zerschling

[57] ABSTRACT

A method of forming a hermetic seal between two silicon wafers includes forming opposing troughs in each of the two wafers. In each trough are formed an isolation layer, a diffusion barrier and a tub of polysilicon. A gold strip is put on one polysilicon tub and the two silicon wafers are brought together and heated in a thermal gradient oven. A silicon gold eutectic is formed which migrates to the diffusion barrier of the silicon wafer.

11 Claims, 3 Drawing Figures

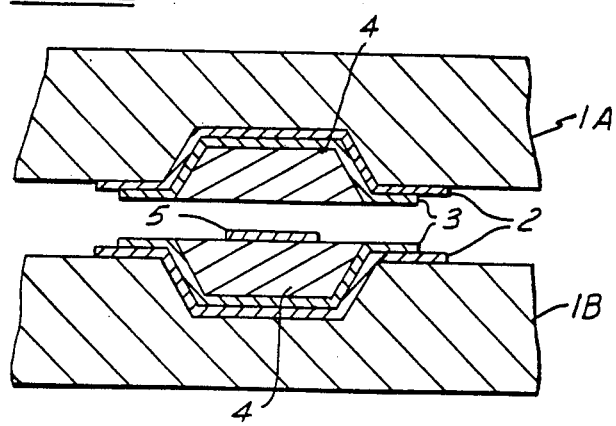
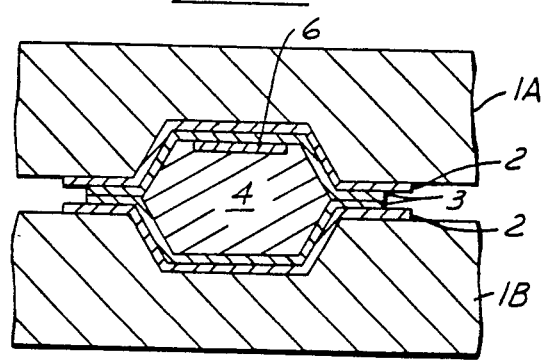
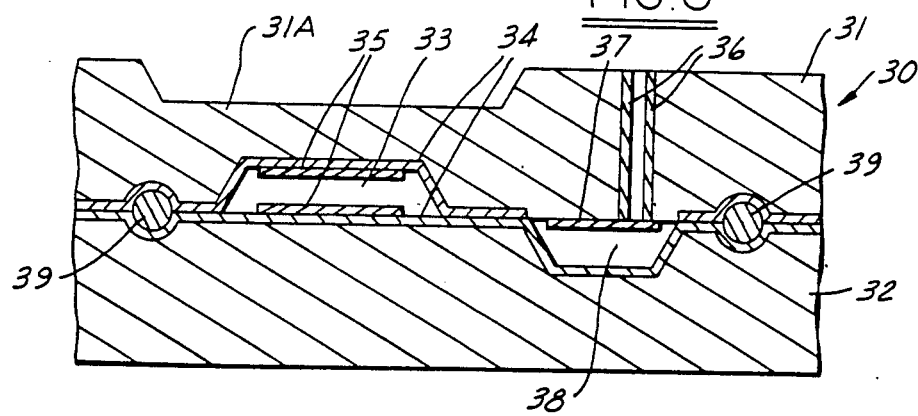

HERMETIC SEALING OF SILICON

BACKGROUND OF THE INVENTION

1. Field of the Invention

This invention relates to hermetic sealing of two silicon wafers.

2. Prior Art

U.S. Pat. No. 4,415,948 teaches bonding of two highly doped silicon wafers, one with an etched cavity, together by using an intermediary glass coating deposited on one wafer. The other wafer is sealed to the coated wafer by electrostatic bonding. In this device, the silicon itself acts as an electrical conductor and no feedthroughs are used. This patent neither teaches nor suggests the special fabrication features which can be advantageously used when lightly doped silicon wafers are used and when contact to metalized electrodes on the inner surfaces of an enclosed cavity between the silicon wafers is made by a highly conductive path in the lightly doped silicon.

U.S. Pat. No. 4,420,790 teaches forming a cavity by putting silicon spacers between two silicon plates that are covered with passivation layers of silicon dioxide and by a combination of silicon dioxide and silicon nitride layers. These layers electrically isolate the capacitor electrodes. The sensor cavity is not hermetically sealed but is open to the ambient. The two silicon plates are joined together by solder bumps and the spacing between the plates is kept constant by the spacers.

U.S. Pat. No. 4,424,713 teaches making a sensor structure including plates of glass, silicon and glass. The silicon is sealed to the glass by electrostatic bonding. The silicon plate has cavities on both sides, the cavity on one side being bigger than on the other side in order to provide stress relief on the silicon diaphragm. The teachings of this patent include relieving stresses at the glass silicon interface where the silicon diaphragm of a pressure sensor is bonded to glass plate by anodic bonding on both its front and back surfaces. Contact to electrodes on plate glass is made by metalized holes in the glass plate.

U.S. Pat. No. 4,390,925 teaches making a sensor with multiple interconnected cavities in a silicon plate bonded electrostatically to a glass plate. Such a structure is taught to be a high pressure sensor.

U.S. Pat. No. 4,184,189 teaches making a sensor with two metalized glass plates bonded together by a sealing glass mixture at about 500° C. The spacing between plates is achieved by shim stock, such as a glass sealing spacer ring.

U.S. Pat. No. 4,207,604 teaches making a pressure sensor with a pair of insulating metalized plates sealed by melting glass frit. A metalized guard ring for the capacitor is used.

U.S. Pat. No. 4,345,299 teaches using two metalized ceramic substrates with an annular sealing ring to form a capacitive pressure transducer.

U.S. Pat. No. 4,177,496 teaches metalizing a pair of thin insulating plates (alumina quartz, pyrex) to form a capacitor. Glass frit or ceramic base material is fired to form a seal.

U.S. Pat. No. 4,261,086 teaches making a sensor by using a silicon wafer with etched cavities and anodically bonding it to a relatively thick glass substrate, for example, 1 mm to 2 mm. The capacitor electrodes are formed by metalizing the glass and highly doping the silicon cavity surface. Electrical connections are made through metalized holes in the glass.

U.S. Pat. No. 4,386,453 teaches making a sensor by using a silicon wafer with etched cavities anodically bonded to a glass substrate. There is metallization of holes drilled in the glass. The metalized holes are used as electrical feedthroughs to make contact to capacitor plates.

Even though there are known ways of coupling two wafers of silicon, there still remains a need for a method of sealing two wafers together which provides a reliable hermetic seal and which can be used at relatively low temperatures so as not to adversely affect electronic circuits which may be on the same piece of silicon. That is, while the application at high temperatures may provide a good seal, such high temperatures may adversely affect the operation or structure of electronic circuits also exposed to such temperature. These are some of the problems this invention overcomes.

SUMMARY OF THE INVENTION

This invention includes a method of joining two silicon wafers wherein a gold/silicon eutectic is formed at the interface by heating a wafer with deposited gold layer and migrating the eutectic away from the interface. The region surrounding the eutectic is surrounded by a barrier to gold migration so that any adjacent circuitry is not affected by the gold.

A method of sealing a silicon wafers to each other in accordance with an embodiment of this invention, is done quickly and at temperatures low enough so as not to affect electronic circuits. Such a method is useful in fabrication of silicon sensors where the signal conditioning circuit is put on the same silicon chip as the sensor and at the same time protecting the circuit from the environment by sealing it into a silicon cavity. The technique can also be used for packaging or protecting electronic circuits on silicon from harsh environments. For example, a capacitive pressure sensor made out of silicon with a protectively sealed signal conditioning circuit can be made.

BRIEF DESCRIPTION OF THE DRAWINGS

FIG. 1 is a cross section of two silicon wafers before joining in accordance with an embodiment of this invention;

FIG. 2 is a cross section of the two wafers of FIG. 1 joined in accordance with an embodiment of this invention; and FIG. 3 is a cross section of two wafers joined in accordance with an embodiment of this invention and including an electronic circuit within the hermetic seal provided by the coupling of the two silicon wafers.

DETAILED DESCRIPTION OF THE INVENTION

In accordance with an embodiment of this invention, the process of sealing two silicon wafers to each other involves forming a gold/silicon eutectic (having a melting point of about 377° F.) on one silicon wafer and migrating the liquid eutectic across the interface into the adjacent wafer in a thermal gradient furnace. Gold diffusion barriers are built into the wafers at migration areas to prevent the gold from inadvertently diffusing into the rest of the silicon wafer and possibly harming the electronic circuits.

Although silicon pieces can be joined by forming a gold/silicon eutectic at the interface by heating a wafer with deposited gold layer above 377° C., it is advantageous to migrate the eutectic away from the interface. This has the advantage that the silicon pieces are now joined by recrystallized silicon. Further, the gold/silicon eutectic can be trapped at a diffusion barrier. As noted before, this prevents the gold from diffusing or migrating to other areas of the silicon wafer and possibly harming electronic circuits.

Referring to FIG. 1, silicon wafers 1A and 1B are shown spaced apart and each having a cup-like opposing silicon dioxide layer 2 in which is nested a metal diffusion barrier 3 preventing further diffusion of gold and filled with a polysilicon 4. A gold film 5 is placed on polysilicon 4 positioned in wafer 1B.

Referring to FIG. 2, after heating in a gradient furnace, wafers 1A and 1B are joined and gold film 5 has been transformed into a gold/silicon eutectic 6 which has migrated upward into wafer 1A and stopped at the middle diffusion barrier 3 of wafer 1A.

Typical processing steps for joining wafers 1A and 1B are discussed below. Troughs are etched into silicon wafers 1A and 1B at a boundary of the desired sealing area. This can be done by conventional silicon processing techniques using photolithography and anisotropic silicon etches. The typical dimensions of the trough are 10 to 200μ wide and 2 to 20 μm deep.

Next, a dense thermal oxide layer 2 is grown over the troughs in silicon wafers 1A and 1B, typical thicknesses of 0.5 to 1.0 μm. Oxide layer 2 prevents metal diffusion barrier 3 from reacting with silicon during thermal migration or other high temperature processes. In addition, oxide layers 2 can provide electrical isolation between silicon wafers 1A and 1B if that is needed for a particular application.

Metal diffusion barrier 3 for blocking the diffusion of gold is deposited over oxide layer 2 in the troughs. Typically, these are titanium/tungsten alloy (about 10:90 wt %) films about 0.1 microns thick and sputter deposited in nitrogen-argon atmosphere. Another example of a metal diffusion barrier is a titanium and platinum layered structure. Advantageously, the metal deposition is done in an oxygen free environment in order to ensure good adhesion to $SiO_2$ layer 2.

In the next step, polysilicon 4 is deposited on wafers 1A and 1B to a thickness equal to or greater than the depth of the trough. Then polysilicon 4 is removed every place except at troughs by lapping. This leaves the depressions filled with polysilicon 4 as shown in FIG. 1. A gold strip 5, narrower than the trough and about 2–4 μm thick is then deposited on wafer 1B to be bonded. The wafers 1A and 1B are brought together so that the troughs of the wafers align up and then are heated in a thermal gradient furnace, in a vacuum or in an inert atmosphere like argon, to about 500° C. or higher. The thermal gradient should be perpendicular to the wafers, about 100 to 200° C. per cm, and wafer 1B with gold strip 5 should be slightly lower temperature than wafer 1A without the gold strip. Thermal gradient across wafers 1A and 1B can be achieved by radiation heating from quartz halogen lamps facing the wafer on one side and radiation cooling on the other side, e.g. the wafers can be placed between quartz halogen lamp sources and a water cooled copper cooling plate. The wafers are separated from the lamps and cooling plate by an appropriate space (occupied by vacuum or inert gas like argon). Quartz halogen lamp heating system is preferred since the silicon wafers can be heated to temperatures very quickly, within seconds.

The gold and silicon forms a eutectic with melting point at 377° C. At higher temperatures this liquid eutectic "droplet" (or line, etc.) will migrate in the direction of thermal gradient. In this case, the eutectic droplet will migrate into the polysilicon in the trough of wafer 1A, melting the silicon on higher temperature side of the droplet and depositing silicon from saturated solution on the lower temperature side of the droplet. The droplet will migrate until it comes into contact with the diffusion barrier 3 of wafer 1A.

Thus, the original space at the troughs of wafer 1A and 1B is now filled in with recrystallized silicon and eutectic 6 will be stopped at diffusion barrier 3 of wafer 1A as shown in FIG. 2. Of course eutectic 6 will solidify when the temperature drops below 377° C. The migration distances can be short, of the order of 10 to 20 microns, and the migration time is in seconds.

A cross section of capacitive pressure sensor 30 using a silicon wafer 31 with a silicon sensing diaphragm 31A bonded to a silicon substrate 32 with signal conditioning circuitry 37 is shown in FIG. 3.

The cavities 33 and 38 for sensor 30 and electronic circuit are etched into silicon wafers 31 and 32. Next, electrical feedthroughs 36 (highly doped p+regions in the n-type Si) for conducting electronic circuitry 37 are made by migration of aluminum/silicon eutectic through n-type silicon wafer 31. With appropriate interconnects at the circuit 37, the p+electrical feedthroughs can also be formed and brought out of wafer 32, or, if needed, some feedthroughs can be made in wafer 31 and others in wafer 32. The sealing areas for the wafers are prepared as discussed previously and shown in FIG. 1 except for the gold deposit 5 of FIG. 1, which is the last step done before sealing. Wafers 31 and 32 are now ready for processing electronic circuitry 37 and for metalizing the capacitor electrodes 35, which are connected to the circuit 37 by interconnects. Finally, a gold strip is evaporated on the seal area and the seal is formed as described earlier. This seals hermetically both the sensor capacitance cavity adjacent capacitor electrodes 35 and the electronic circuitry 37 from outside environment. The silicon above the electronic circuitry 37 adjacent cavity 38 is considerably thicker than sensor diaphragm 31A above cavity 33. This insures that there will be no appreciable deflection of silicon at circuit location due to the applied external pressure that is being measured.

Various modifications and variations will no doubt occur to those skilled in the various arts to which this invention pertains. For example, the particular shape of the diffusion barrier and polysilicon tub may be varied from that disclosed herein. These and all other variations which basically rely on the teachings through which this disclosure has advanced the art are properly considered within the scope of this invention.

I claim:

1. A method of forming a hermetic seal between a first silicon wafer and a second silicon wafer including the steps of:
    forming opposing troughs in each of said two silicon wafers;
    forming an isolation layer suitable for forming a barrier between silicon and metal during heating;
    forming a diffusion barrier suitable for limiting diffusion of gold;
    forming a tub of polysilicon in the cavity lined by the diffusion barrier;
    forming a gold strip on one of the polysilicon tubs;

positioning the two silicon wafers adjacent each other so that the gold strip on one polysilicon tub aligns with the polysilicon tub of the other wafer; and heating the adjacent silicon wafers in a thermal gradient so as to form a silicon gold eutectic which migrates to the diffusion barrier of the silicon wafer which do not have gold film on the polysilicon tub.

2. A method as recited in claim 1 wherein the step of forming an isolation layer includes the step of forming a silicon dioxide layer.

3. A method as recited in claim 2 wherein the step of forming a metal diffusion barrier for gold includes forming a titanium/tungsten alloy film having a ratio of about 10:90 wt % and having a thickness of about 0.1 microns.

4. A method as recited in claim 3 wherein the gold strip is formed narrower than the trough and has a thickness of about $2 \propto 4$ microns.

5. A method as recited in claim 4 wherein the thermal gradient is perpendicular to the two silicon wafers and is about 100–200° C. per centimeter.

6. A method as recited in claim 5 wherein typical dimensions of the trough are 10–200 microns wide and about 2–20 microns deep and the isolation layer grown in the troughs is a thermal oxide layer having a typical thickness of about 0.5 to 1.0 microns.

7. A method of joining two silicon wafers including the step of migrating a gold silicon eutectic across the interface between the two wafers to form a bond.

8. A method as recited in claim 7 including the further step of using a gold diffusion barrier to stop gold atoms from migrating into portions of the silicon wafer on the other side of the gold diffusion barrier.

9. A method as recited in claim 8 further comprising the use of a silicon dioxide layer between the silicon wafer and the gold diffusion barrier to provide adhesion to the metal diffusion barrier and preventing the formation of metal silicides in case of high temperature processing or usage.

10. A method as recited in claim 9 further comprising forming an electronic circuitry region within a region bounded by a seal formed by migrating a gold silicon eutectic.

11. A method as recited in claim 10 further comprising the step of forming highly doped p+paths in an n-type silicon wafer to make contact to the electronic circuitry within the hermetic seal thereby providing electrical contact without any interference with the hermetic seal.

* * * * *